Figure 1:
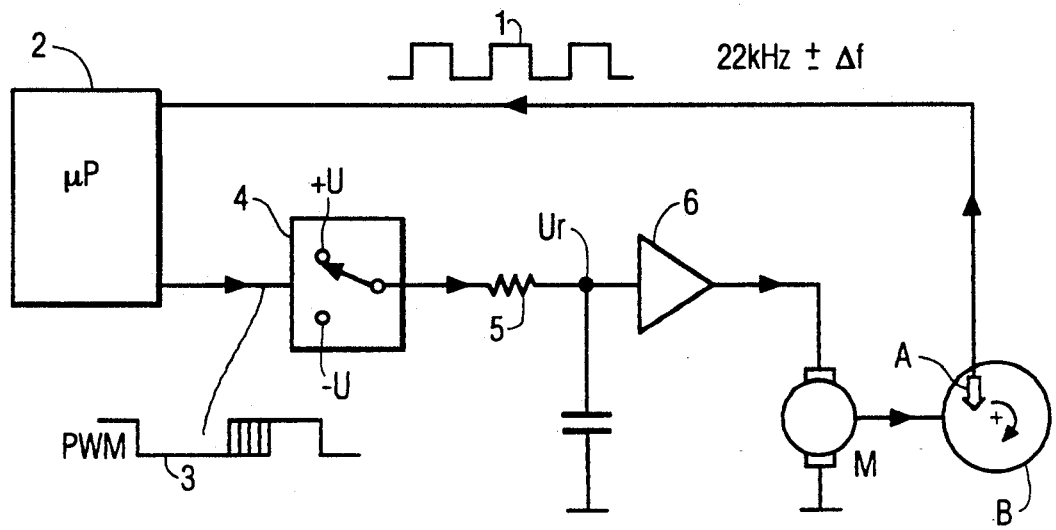

United States Patent [19]

Bigge

[11] Patent Number: 5,298,812
[45] Date of Patent: Mar. 29, 1994

[54] REGULATING CIRCUIT AS FOR CONTROLLING THE SPEED OF A MOTOR

[75] Inventor: Franz Bigge, Villingen, Fed. Rep. of Germany

[73] Assignee: Deutsche Thomson-Brandt GmbH, Villingen-Schwenningen, Fed. Rep. of Germany

[21] Appl. No.: 779,719

[22] Filed: Oct. 18, 1991

[30] Foreign Application Priority Data

Apr. 19, 1989 [DE] Fed. Rep. of Germany ....... 3912837

[51] Int. Cl.$^5$ ............................. H03K 5/19; H03L 7/00
[52] U.S. Cl. ...................................... 307/519; 307/271; 307/246; 328/141; 331/17; 369/240; 360/73.03
[58] Field of Search ................................ 369/239, 240; 360/73.01, 73.03; 328/140, 141; 331/17, 34, 35, 25; 307/519, 271, 246

[56] References Cited

U.S. PATENT DOCUMENTS

| | | | |
|---|---|---|---|
| 4,167,711 | 9/1979 | Smoot | 331/17 |
| 4,439,849 | 3/1984 | Nabeshima | 369/240 |
| 4,605,901 | 8/1986 | Kobori et al. | 328/140 |
| 4,675,855 | 6/1987 | Iso et al. | 369/240 |
| 4,745,372 | 5/1988 | Miwa | 331/8 |
| 4,803,705 | 2/1989 | Gillingham et al. | 331/17 |
| 5,081,427 | 1/1992 | Suarez | 331/17 |
| 5,095,288 | 3/1992 | Dent | 331/17 |
| 5,121,085 | 6/1992 | Brown | 331/17 |

FOREIGN PATENT DOCUMENTS

| | | |
|---|---|---|
| 0085615 | 8/1983 | European Pat. Off. . |
| 0123946 | 11/1984 | European Pat. Off. . |
| 0238041 | 9/1987 | European Pat. Off. . |
| 2370388 | 6/1978 | France . |

OTHER PUBLICATIONS

Arter et al., "Motor Control Circuit", IBM Technical Bulletin vol. 13, No. 3, pp. 689–690, Aug. 1970.

Penner, "Digital television tuner uses MOS LSI and nonvolatile memory," Electronics, vol. 49, No. 7, pp. 86–90, Apr. 1, 1976.

Primary Examiner—William L. Sikes
Assistant Examiner—Toan Tran
Attorney, Agent, or Firm—Joseph S. Tripoli; Eric P. Herrmann

[57] ABSTRACT

A regulating circuit for controlling the speed of a rotating disc to provide a constant frequency signal from the disc includes a signal pickup device which moves radially along the disc and provides a velocity signal the frequency of which changes by a factor $\Delta f$ as the position of the pickup device on the disc changes. A processor receives the velocity signal and produces a control signal in accordance with the factor $\Delta f$. A change-over switch provides a fine range voltage and a coarse range voltage which are used to control the speed of the disc in a fine range mode and a coarse range mode, respectively.

11 Claims, 2 Drawing Sheets

REGULATING CIRCUIT AS FOR CONTROLLING THE SPEED OF A MOTOR

This is a continuation of PCT application PCT/EP 90/00560 filed Apr. 10, 1990 by Franz Bigge and titled "CONTROL CIRCUIT."

The invention is directed to a regulating circuit for a disc player such as a CD or MOD.

A frequency regulating circuit is required for recording on a disc with a helical track, for example, a CD or MOD disc. Such a circuit is described in DE-AS 20 00 907. A constant frequency pilot signal is recorded along the helical track of the disc and the speed of the disc is controlled during recording and reproduction so that the peripheral speed of the signal pickup device remains constant as the distance of the pickup device from the center of the disc changes as the disc rotates. The pickup signal from the disc is input to a processor which provides a pulse-width modulated (PWM) signal in accordance with the frequency deviation of the pickup signal. An analog voltage for regulating the speed of the disc is produced from the PMW signal via a microprocessor, a change-over switch and a low-pass filter. The PWM signal has 256 steps over the total range of the frequency deviation which is to be adjusted. For coarse control, which is mainly effective at the moment of the switching on of the regulating circuit and with trapping the regulating circuit, 256 steps is usually sufficient. However, for permanent synchronous control 256 steps is insufficient for precise and accurate regulation of the motor speed. Precise speed control requires greater resolution and thus, more than 256 steps are required. It is possible to obtain a higher number of steps by using a microprocessor which provides 2048 steps, e.g. an 11 bit microprocessor. A microprocessor having this capability is not typically readily available and an 8 bit, 256 step microprocessor must be used.

The invention is directed to a regulating circuit of the type described which provides a range of fine control having a higher resolution and without impairment of the range of coarse control, using a 256 step microprocessor. With the invention, fine and coarse ranges of control are achieved using two change-over switches which receive different direct voltages. A selector switch selects one of the change-over switches in accordance with a deviation in the PWM signal. The fine control range represents only a portion of the total control range of the 256 steps available from the processor. For fine motor control, which is present during the permanent synchronous operation, i.e. most of the time, high resolution is achieved utilizing the number of steps available from the PWM. However, the range of coarse control is not reduced. In fact, the coarse control resolution is correspondingly smaller. However, this is not a disadvantage because the coarse control range is only effective at the moment of switching on and for trapping situations when a smaller number of steps can be advantageous.

IN THE FIGURES

Figure 2:
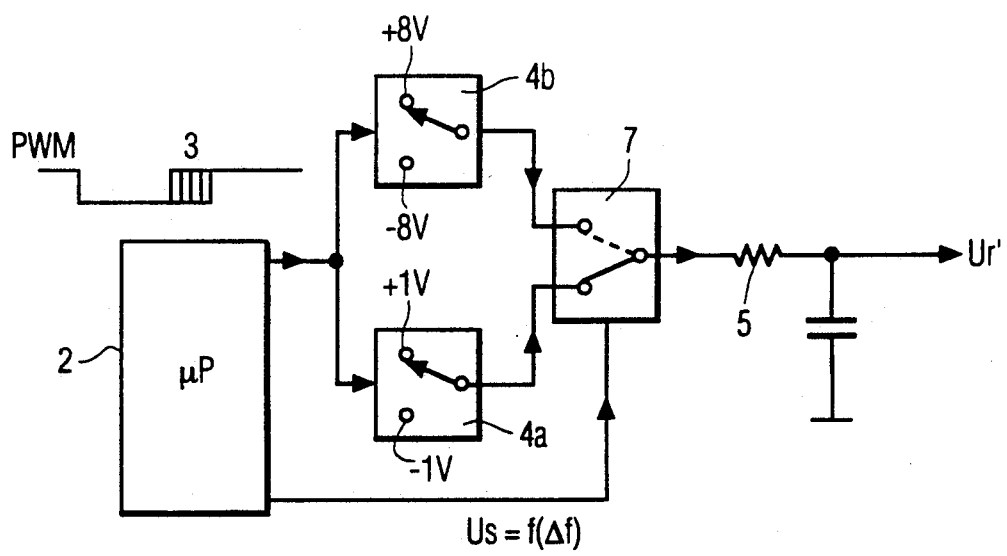
Figure 3:
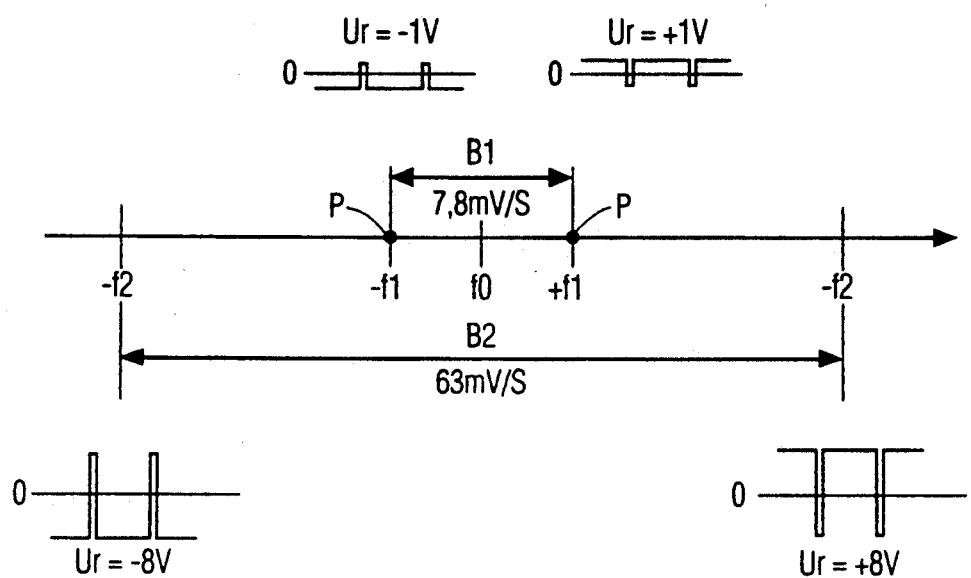
Figure 4:
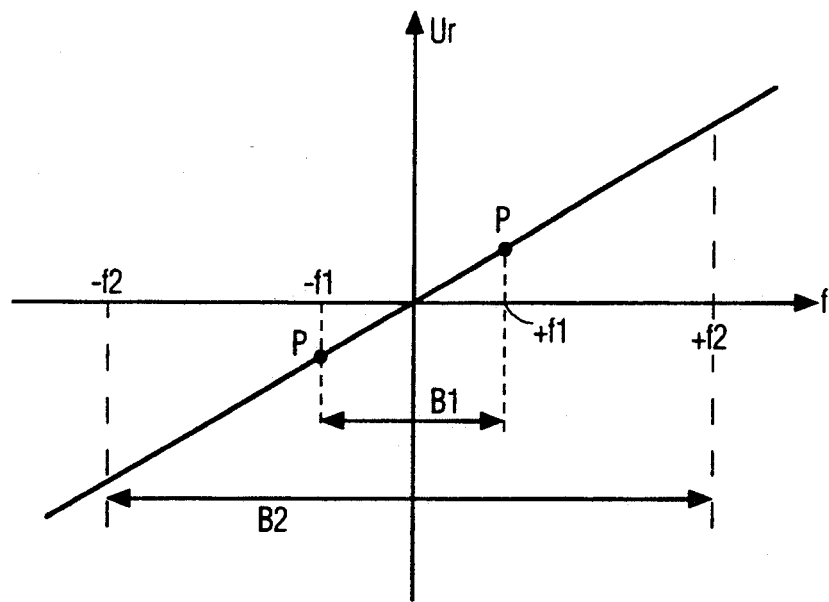

FIG. 1 is a prior art disc player motor speed circuit.
FIG. 2 is a preferred embodiment.
FIG. 3 is a diagram useful in explaining the operation of the preferred embodiment of FIG. 2.
FIG. 4 shows how the regulating voltage Ur varies with frequency.

In FIG. 1, a motor M drives a CD or MOD disc P having a helical track. A pickup device A scans disc P and supplies a signal 1, having a frequency of 22 kHz, for example. In order to maintain a constant linear speed of the pickup device A with respect to the disc P, the rotational speed of the disc P must be changed as the distance of the pickup device from the center of the disc changes. The speed change insures that the signal 1 has a constant frequency. The signal 1 is input to a microprocessor 2 and the frequency is measured. Based on the frequency measurement the microprocessor 2 supplies a pulse-width modulated (PWM) signal 3, having a frequency of 8 kHz, for example, the pulse width of which is modulated according to the particular frequency deviation $\Delta f$ based on a pulse width repetition rate of 1:1. The PWM signal 3 controls a change-over switch 4, the output of which is switched between direct voltages $+U1$ and $-U1$. A low pass filter 5, which is connected to the output of the change-over switch 4, supplies a regulating voltage Ur. The amplitude and the polarity of the regulating voltage Ur are indicative of the frequency deviation of the signal 1 from the nominal frequency of 22 KHz. An amplifier 6 inputs the regulating voltage Ur to the motor M to control the motor speed as needed to maintain a constant frequency of the signal 1.

In FIG. 2 the disc P, motor M and amplifier 6 are omitted for simplicity but are connected to the low pass filter 5 the same as shown in FIG. 1. In FIG. 2, the PWM signal 3 from the microprocessor 2 is simultaneously input to two change-over switches 4a and 4b. Switch 4a receives voltages V1 and V2 which may be $\pm 1V$ and switch 4b receives voltage V3 and V4 which may be $\pm 8$ V. The input voltage to a low-pass 5 is switched by a selector switch 7 which receives the outputs of the change-over switches 4a and 4b in accordance with the frequency deviation $\Delta f$ of the signal 1. The selection of switches 4a and 4b by the selector switch 7 is controlled by a control signal Us, which is generated by the processor 2 depending on the frequency deviation $\Delta f$ of the signal 1. The control signal Us, thus, effects the selection between a fine control range and a coarse control range in accordance with the frequency deviation $\Delta f$.

In FIG. 3 a fine control range is illustrated for a frequency deviation $\Delta f$ of $-f1$ and $+f1$ from a nominal frequency fo of the signal 1. For the fine control range, the selector switch 7 is switched to the output of the change-over switch 4a and the control voltage Ur can be any voltage between $+1$ V and $-1$ V. The processor 2 utilizes the fine control range to provide a frequency deviation $\Delta f$ of $-f1$ or $+f1$ to effect pulse-width modulation of 100 percent in the PWM signal 3. The 256 voltage steps of the pulse width modulated signal 3 which the microprocessor 2 provides are divided in the fine control range B1 so that the 2 volt (2000 mV) range of the regulating voltage Ur is divided into 256 steps of fine control voltage, with each step being equal to 2000 mV/256=7.8 mV per step S. This step value is sufficiently small for the desired fine frequency regulation of the motor M in the stationary synchronous range B1.

When the frequency deviation $\Delta f$ of the voltage 1 exceeds the values $-f1$ or $+f1$ the change-over switch 4a cannot be used because it cannot supply a control voltage Ur higher than $+1$ V or $-1$ V. Therefore, the selector switch 7 is switched to the output of the change-over switch 4b by the control signal Us. Thus, at the transition point P the selector switch 7 is switched from the fine control range B1 to the coarse control range B2. Because the direct voltages applied to switch 4b are a higher 8 V, the regulating voltage Ur can now assume values between −8 V and +8 V. However, if the modulation of the signal 3 remains at 100 per cent when the transition point P is reached, the regulating voltage would undesirably increase at the transition point. Therefore, the modulation percentage of the PWM signal 3 is changed to a smaller value at the transition point P simultaneously with the operation of the selector switch 7 to initially maintain regulating voltage Ur constant. The change can be from 99 per cent to 56 per cent, for example. In the coarse control range the operation range B2 increases between −f2 and +f2 (FIG. 4). The number of steps of the PWM signal 3 remains at 256 and the level of each step is determined by the 16 volt (1600 mV) range of the regulating voltage Ur between the −3 V and +8 V voltages. Therefore, the voltage of each step is a maximum of 16000 mV/256=62.5 mV per step S of the PWM signal 3 and the resolution is reduced from that of the fine range B1 in the desired manner. In FIG. 4 it appears that the coarse control is operational in the B1 range. However, in this range the selector switch 7 is switched to the change-over switch 4a which selects the fine control range B1.

Instead of the two change-over switches 4a and 4b, which provide the two different direct voltages, a single change-over switch can be switched by the PWM signal 3 between two different direct voltages, which are provided to the switch. The inputs of the single change-over switch can be supplied by an electronically stabilized power supply the output voltages of which is electronically switched between the 1 V and 8 V voltages by the control voltage Us. The selector switch 7 would then be superfluous and the control voltage Us would control the stabilized power supply to provide the desired voltage to change-over switch 4 (FIG. 1) to affect the two change-over between the ranges B1 and B2. Also, more than two change-over switches 4, which are controlled between two voltages, can be utilized to provide more than two control ranges. The direct voltages which are applied to the inputs of a change-over switch need not be of the same value positive and negative value, they can also be different levels of the same polarity. For the description above, the regulating voltage Ur has a direct voltage mean value of Ur=0 when the signal 1 has a nominal frequency of 22 kHz. Accordingly, it is possible to adjust the nominal speeds of different motors at differing operating points. Because a microprocessor is used, such an adjustment can be made in a short test run (approx. 1 s) each time the device turned switched on and the effects of motor aging and other motor characteristic changes can be compensated for.

I claim:

1. A regulating circuit for controlling the speed of a rotating disc to provide a constant frequency signal from said disc comprising:
    a signal pickup device for moving radially along said disc and providing a velocity signal having a frequency indicative of the velocity of said pickup device with respect to said disc whereby said frequency changes by a factor Δf as said pickup device moves radially with respect to said disc;
    processor means for receiving said velocity signal and producing a control signal and a pulse width modulated signal having selectable modulation ranges in accordance with said factor Δf;
    change-over switch means responsive to said pulse width modulated signal for providing a fine range voltage and a coarse range voltage;
    selector switch means responsive to said control signal for providing a regulating signal to control the speed of said rotating disc, said selector switch means passing said fine range voltage when said factor Δf is below a preselected level and passing said coarse range voltage when said factor Δf is above said preselected level, and when said selector switch means is caused to switch between passing said fine range voltage and said coarse range voltage, said processor means is caused to adjust the modulation depth of said pulse width modulated signal such that an abrupt average voltage change is not passed by said selector switch means.

2. The regulating circuit of claim 1 wherein said change-over switch means includes first and second change-over switches for individually providing said fine range voltage and said coarse range voltage.

3. The regulating circuit of claim 2 wherein said fine range voltage extends between first and second voltages separated by a first selected voltage and wherein said coarse range voltage extends between third and fourth voltages separated by a second selected voltage larger than said first selected voltage.

4. The regulating circuit of claim 3 wherein said first and second voltages are equal in amplitude and opposite in polarity, and wherein said third and fourth voltages are equal in amplitude and opposite in polarity.

5. The regulating circuit of claim 4 wherein said processor is a microprocessor.

6. Apparatus for controlling the speed of a motor comprising:
    means coupled to said motor for providing a speed signal indicative of the speed of said motor;
    processing means, responsive to said speed signal, for providing a control signal having first and second states if the speed of said motor is within a predetermined amount of a desired speed or not within a predetermined amount of said desired speed respectively, and for providing a pulse width modulated signal having selectable first and second pulse width modulation ranges dependent upon the divergence of said motor speed from said desired speed;
    first means, responsive to said pulse width modulated signal for providing a motor speed control signal having a first range of values defined by relatively positive and negative values V1 and V2;
    second means, responsive to said pulse width modulated signal, for providing a motor speed control signal having a second range of values defined by relatively positive and negative values V3 and V4; and
    selector switch means, responsive to the first state of said control signal, for coupling said first means to regulate the speed of said motor, and responsive to the second state of said control signal, for coupling said second means to regulate the speed of said motor, and wherein said processing means switches between said first and second ranges and adjusts the percent of modulation of said pulse width modulated signal when said selector switch means is caused to change the coupling between said first and second means to preclude an abrupt change in an average value of signal to regulate the speed of said motor.

7. The apparatus set forth in claim 6 wherein said values V1 and V2 defining the range of speed control signal provided by said first means are equal positive and negative values, and said values V3 and V4 defining the range of speed control signal provided by said second means are also equal positive and negative values, but different from said values V1 and V2.

8. The apparatus set forth in claim 6 further including low pass filter means for coupling said selector switch means to control the speed of said motor.

9. Apparatus for controlling the speed of a motor comprising:
   means coupled to said motor for providing a speed signal indicative of the speed of said motor;
   processing means, responsive to said speed signal, for providing a control signal which indicates if the speed of said motor is within a predetermined amount of a desired speed, and for providing a pulse width modulated signal having pulse widths dependent upon the divergence of said motor speed from said desired speed;
   means responsive to said speed signal and said pulse width modulated signal, for providing a pulse width modulated signal which swings between first and second values (V1 and V2) if the speed signal indicates that the speed of said motor is within said predetermined amount of said desired speed, and which swings between third and fourth values (V3 and V4) if the speed signal indicates that the speed of said motor is not within said predetermined amount of said desired speed, and wherein the percent modulation of said pulse width modulated signal is adjusted to preclude providing abrupt average signal changes when said means for providing a pulse width modulated signal changes from providing a signal which swings between said first and second values to one which swings between said third and fourth values; and
   low pass filter means, coupled to said means for providing a pulse width modulated signal, for coupling low pass filtered pulse width modulated signal as a speed regulating signal to said motor.

10. The apparatus set forth in claim 9 wherein said first and second values (V1 and V2) are equal positive and negative values, and said third and fourth values (V3 and V4) are also equal positive and negative values, but different from said first and second values (V1 and V2).

11. A regulating circuit comprising:
    a utilization means responsive to a filtered regulating signal, said utilization means providing feedback signal indicative of the operating condition of said utilization means;
    processing means including a pulse width modulator for generating a control signal which indicates if said feedback signal is within predetermined limits and for generating a pulse width modulated signal having selectable modulation ranges;
    means responsive to said control signal and said pulse width modulated signal for generating a regulating signal swinging between first and second values (V1 and V2) when said feedback signal is within said predetermined limits and swinging between third and fourth values (V3 and V4) when said feedback signal is not within said predetermined limits, and wherein said first and second values fall between said third and fourth values, and wherein the modulation range of said pulse width modulated signal is changed to preclude abrupt changes in the average value of signal provided by said means for generating a regulating signal when said means for generating a regulating signal switches between generating a signal swinging between said first and second values and signal swinging between said third and fourth values; and
    low pass filter means responsive to said regulating signal for providing said filtered regulating signal.

* * * * *